(12) United States Patent
Chang Chien et al.

(10) Patent No.: US 11,769,763 B2
(45) Date of Patent: Sep. 26, 2023

(54) PACKAGE STRUCTURE AND MANUFACTURING METHOD THEREOF

(71) Applicant: Powertech Technology Inc., Hsinchu County (TW)

(72) Inventors: Shang-Yu Chang Chien, Hsinchu County (TW); Nan-Chun Lin, Hsinchu County (TW); Hung-Hsin Hsu, Hsinchu County (TW)

(73) Assignee: Powertech Technology Inc., Hsinchu County (TW)

( * ) Notice: Subject to any disclaimer, the term of this patent is extended or adjusted under 35 U.S.C. 154(b) by 0 days.

(21) Appl. No.: 17/384,804

(22) Filed: Jul. 26, 2021

(65) Prior Publication Data
US 2022/0045041 A1 Feb. 10, 2022

Related U.S. Application Data

(60) Provisional application No. 63/061,807, filed on Aug. 6, 2020.

(30) Foreign Application Priority Data

Jun. 28, 2021 (TW) .................................. 110123489

(51) Int. Cl.
*H01L 25/16* (2023.01)
*H01L 21/56* (2006.01)
(Continued)

(52) U.S. Cl.
CPC ........ *H01L 25/167* (2013.01); *H01L 23/3121* (2013.01); *H01L 23/3185* (2013.01); *H01L 23/49811* (2013.01); *H01L 23/5385* (2013.01); *H01L 23/5386* (2013.01); *H01L 23/5389* (2013.01); *H01L 24/16* (2013.01); *H01L 24/27* (2013.01); *H01L 24/32* (2013.01); *H01L 24/73* (2013.01); *H01L 24/92* (2013.01); *H01L 2224/16227* (2013.01); *H01L 2224/26175* (2013.01); *H01L 2224/27013* (2013.01);
(Continued)

(58) Field of Classification Search
CPC ............ H01L 23/3121; H01L 23/3157; H01L 25/167; H01L 21/563
See application file for complete search history.

(56) References Cited

U.S. PATENT DOCUMENTS

2009/0017582 A1* 1/2009 Masumoto ............ H01L 21/563
257/E21.502
2020/0168552 A1* 5/2020 Ha ...................... H01L 23/5385

\* cited by examiner

*Primary Examiner* — Michele Fan
(74) *Attorney, Agent, or Firm* — JCIPRNET

(57) ABSTRACT

A package structure including a first die, an encapsulant, a first circuit structure, a second circuit structure, a conductive connector, a second die, and a filler is provided. The encapsulant covers the first die and has a first surface and a second surface opposite to each other. The first circuit structure is disposed on the first surface. The second circuit structure is disposed on the second surface. The conductive connector penetrates the encapsulant. The second die is disposed on the second circuit structure. The second die has an optical signal transmission area. The filler is disposed between the second die and the second circuit structure. An upper surface of the second circuit structure has a groove. The upper surface includes a first area and a second area disposed on opposite sides of the groove. The filler directly contacts the first area. The filler is disposed away from the second area.

14 Claims, 13 Drawing Sheets

(51) Int. Cl.
*H01L 23/538* (2006.01)
*H01L 23/498* (2006.01)
*H01L 23/31* (2006.01)
*H01L 23/00* (2006.01)

(52) U.S. Cl.
CPC ............... *H01L 2224/32225* (2013.01); *H01L 2224/73204* (2013.01); *H01L 2224/92125* (2013.01)

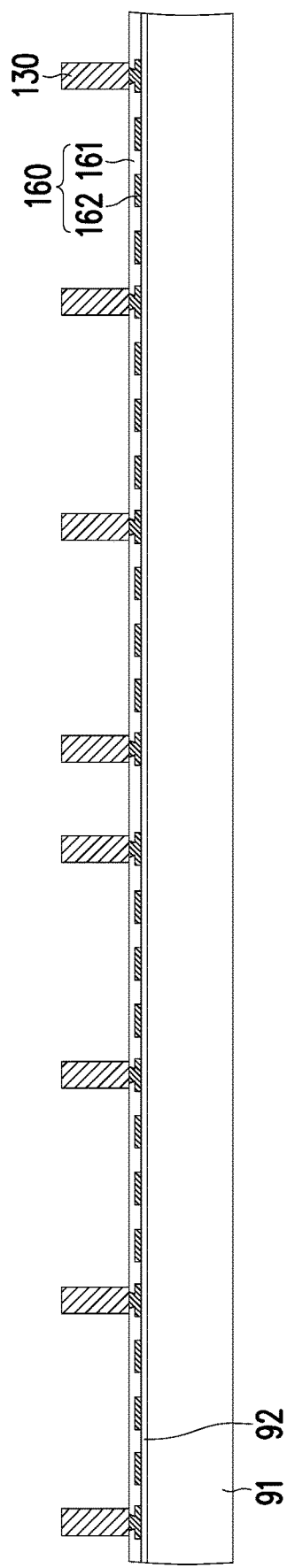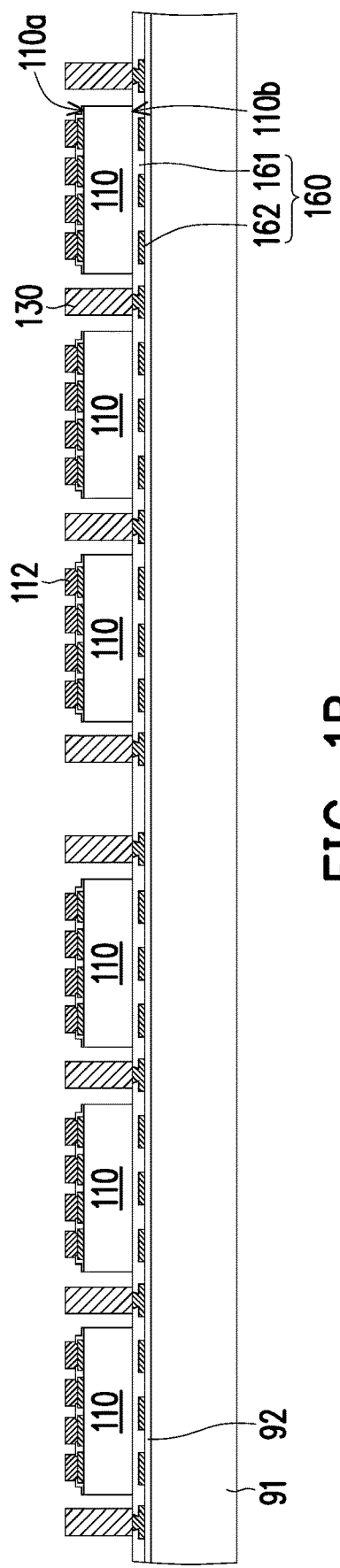
FIG. 1A
FIG. 1B

PACKAGE STRUCTURE AND MANUFACTURING METHOD THEREOF

CROSS-REFERENCE TO RELATED APPLICATION

This application claims the priority benefit of U.S. provisional application Ser. No. 63/061,807, filed on Aug. 6, 2020, and Taiwan application serial no. 110123489, filed on Jun. 28, 2021. The entirety of each of the above-mentioned patent applications is hereby incorporated by reference herein and made a part of this specification.

BACKGROUND

Technical Field

The disclosure relates to a package structure and a manufacturing method thereof, and particularly relates to a package structure with a groove on a redistributed circuit structure and a manufacturing method thereof.

Description of Related Art

Along with the increase of data amount and/or the increasing demand of data centers, the demand for silicon photonics integrated circuits has also gradually increased. Therefore, it has become an urgent problem at present to improve the quality or applicability of package structures with the silicon photonics integrated circuit.

SUMMARY

The disclosure is directed to a package structure and a manufacturing method thereof, which have better quality.

The disclosure provides a package structure including a first die, an encapsulant, a first redistributed circuit structure, a second redistributed circuit structure, a conductive connector, a second die and a filler. The encapsulant covers the first die and has a first molding surface and a second molding surface opposite to the first molding surface. The first redistributed circuit structure is disposed on the first molding surface of the encapsulant. The second redistributed circuit structure is disposed on the second molding surface of the encapsulant and is electrically connected to the first die. The conductive connector penetrates through the encapsulant and is electrically connected to the first redistributed circuit structure and the second redistributed circuit structure. The second die is disposed on the second redistributed circuit structure and is electrically connected to the second redistributed circuit structure. The second die has an optical signal transmission area. The filler is disposed between the second die and the second redistributed circuit structure. An upper surface of the second redistributed circuit structure has a groove. The upper surface includes a first area and a second area disposed on two opposite sides of the groove. The filler directly contacts the first area. The filler is disposed away from the second area.

The disclosure provides a manufacturing method of a package structure including following steps. A preliminary structure is provided, which includes a first die, an encapsulant, a first redistributed circuit structure, a second redistributed circuit structure, a conductive connector, where the encapsulant covers the first die and has a first molding surface and a second molding surface opposite to the first molding surface, where the first redistributed circuit structure is disposed on the first molding surface of the encapsulant, the second redistributed circuit structure is disposed on the second molding surface of the encapsulant and is electrically connected to the first die, an upper surface of the second redistributed circuit structure has a groove, the upper surface includes a first area and a second area disposed on two opposite sides of the groove, and the conductive connector penetrates through the encapsulant and is electrically connected to the first redistributed circuit structure and the second redistributed circuit structure. A second die is disposed on the second redistributed circuit structure and is electrically connected to the second redistributed circuit structure, where the second die has an optical signal transmission area. A filler is formed between the second die and the second redistributed circuit structure, where the filler directly contacts the first area, and the filler is disposed away from the second area.

Based on the above description, the manufacturing method of the package structure of the disclosure may lead to better quality of the package structure, and/or the package structure of the disclosure may have better quality.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

FIG. 1A to FIG. 1F are schematic partial cross-sectional views of a part of a manufacturing method of a package structure according to a first embodiment of the disclosure.

DESCRIPTION OF THE EMBODIMENTS

Figure 1C:
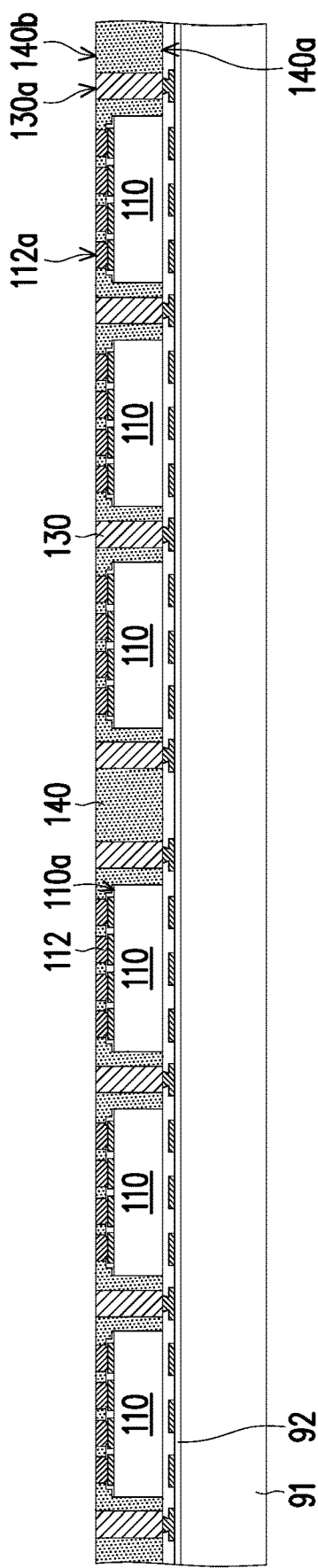

Unless explicitly stated otherwise, directional terms used herein (for example, up, down, left, right, front, back, top, bottom) are only used as a reference for viewing the drawings and are not intended to imply absolute orientations.

Unless specifically stated otherwise, any method described herein is in no way intended to be construed as requiring its steps to be executed in a specific order.

The disclosure will be explained more fully with reference to the drawings of the embodiments. However, the disclosure may also be embodied in various different forms and should not be limited to the embodiments described herein. Thicknesses, sizes or magnitudes of layers or regions in the drawings will be exaggerated for clarity's sake. The same or similar reference numbers indicate the same or similar elements, which are not repeated in the following paragraphs.

FIG. 1A to FIG. 1F are schematic partial cross-sectional views of a part of a manufacturing method of a package structure according to a first embodiment of the disclosure. FIG. 1G is a schematic partial cross-sectional view of a package structure according to the first embodiment of the disclosure. FIG. 1H is a schematic partial top view of a package structure according to the first embodiment of the disclosure. FIG. 1G may be an enlarged schematic diagram of a region R1 in FIG. 1F. FIG. 1H may be a schematic top view of FIG. 1F. In addition, for clarity's sake, a part of film layers or components is omitted in the drawings (for example, FIG. 1H), and/or another part of the film layers or components is illustrated in a perspective manner.

Referring to FIG. 1A, a first redistributed circuit structure 160 is formed on a carrier board 91. The disclosure has no particular limitation on the carrier board 91, as long as the carrier board 91 is adapted to carry film layers formed thereon or components arranged thereon.

In an embodiment, a release layer 92 may be formed on the carrier board 91, but the disclosure is not limited thereto. The release layer 92 is, for example, a light to heat conversion (LTHC) adhesive layer or other similar release layers, which is not limited by the disclosure.

In the embodiment, the first redistributed circuit structure 160 may include an insulating layer 161 and a conductive layer 162. The first redistributed circuit structure 160 may be formed by a commonly used semiconductor process (such as a coating process, a deposition process, a lithography process, and/or an etching process), so that detail thereof is not repeated. A number of layers of the insulating layer 161 and/or the conductive layer 162 is not limited by the disclosure. In addition, in FIG. 1A, the form of the insulating layer 161 and/or the conductive layer 162 is only shown as an example. For example, a corresponding part of the conductive layer 162 may constitute a corresponding circuit. In addition, a layout design of the aforementioned circuit may be adjusted according to a design requirement, which is not limited in the disclosure.

Referring to FIG. 1A again, in the embodiment, a plurality of conductive connectors 130 may be arranged or formed on the first redistributed circuit structure 160. The corresponding conductive connector 130 may be electrically connected to the corresponding circuit in the first redistributed circuit structure 160.

In an embodiment, the conductive connector 130 may include a pre-formed conductive member. For example, the conductive connector 130 may include a pre-formed conductive pillar, but the disclosure is not limited thereto.

In an embodiment, the conductive connector 130 may be formed by a commonly used semiconductor process (such as a lithography process, a sputtering process, an electroplating process, and/or an etching process), but the disclosure is not limited thereto. For example, the conductive connector 130 may include a plating core layer and a seed layer covering the plating core layer, but the disclosure is not limited thereto. In an embodiment, the seed layer may surround the plating core layer, but the disclosure is not limited thereto. In an embodiment, the seed layer may be disposed under the plating core layer.

Referring to FIG. 1B, a first die 110 is arranged on the first redistributed circuit structure 160.

The first die 110 has a first active surface 110a and a first back surface 110b. The first back surface 110b is opposite to the first active surface 110a. In the embodiment, the first die 110 may be disposed on the first redistributed circuit structure 160 in such a manner that the first back surface 110b faces the carrier board 91.

In the embodiment, the first active surface 110a of the first die 110 may have a plurality of metal bumps 112. In subsequent steps, the metal bump 112 may probably reduce damage to the first active surface 110a of the first die 110.

In an embodiment, the first back surface 110b of the first die 110 may have an adhesive layer (not shown). The adhesive layer is, for example, a die attach film (DAF). The first die 110 may be fixed on the first redistributed circuit structure 160 through the DAF.

In the embodiment, the first die 110 does not have a through silicon via (TSV), but the disclosure is not limited thereto.

It should be noted that the disclosure does not limit an order of forming the conductive connectors 130 and arranging the first dies 110. In the embodiment, the conductive connectors 130 may be formed first as shown in FIG. 1A, and then the first dies 110 may be configured as shown in FIG. 1B. In an embodiment that is not shown, the first dies 110 may be configured first, and then the conductive connectors 130 is formed.

Referring to FIG. 1B to FIG. 1C, an encapsulant 140 is formed on the first redistributed circuit structure 160. The encapsulant 140 may cover the first dies 110 and the conductive connectors 130. The encapsulant 140 has a first molding surface 140a and a second molding surface 140b opposite to the first molding surface 140a. The first molding surface 140a is a surface facing the first redistributed circuit structure 160.

In an embodiment, a molding material (not shown) may be formed on the first redistributed circuit structure 160. In addition, after curing the molding material, a planarization process may be performed to form the encapsulant 140. The planarization process may be, for example, grinding, polishing or other suitable planarization steps. The encapsulant 140 may expose an upper surface 112a of the metal bump 112 of the first die 110 and an upper surface 130a of the conductive connector 130. In other words, the second molding surface 140b of the encapsulant 140 may be coplanar with the upper surface 112a of the metal bump 112 of the first die 110 and the upper surface 130a of the conductive connector 130.

In an embodiment, since the first active surface 110a of the first die 110 has the metal bumps 112, the possibility of damage to the first active surface 110a of the first die 110 during the aforementioned planarization step may be reduced.

Figure 1D:
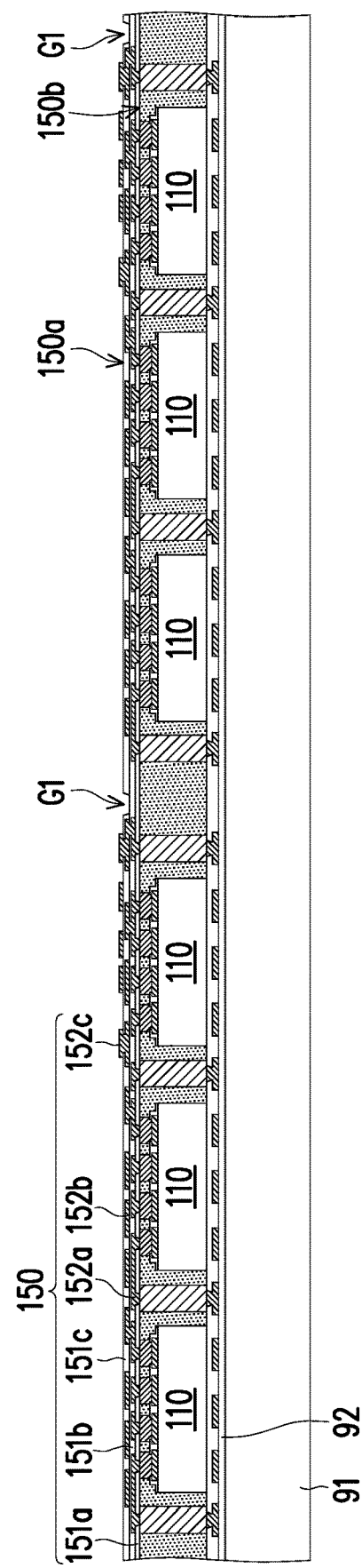

Referring to FIG. 1C to FIG. 1D, a second redistributed circuit structure 150 is formed on the second molding surface 140b of the encapsulant 140. The second redistributed circuit structure 150 may be formed by a commonly used semiconductor process, so that detail thereof is not repeated. In addition, the disclosure does not limit a number of film layers and a layout design of the circuit in the second redistributed circuit structure 150. For example, as shown in FIG. 1D, the second redistributed circuit structure 150 includes three layers of insulating layers 151a, 151b, 151c and three layers of conductive layers 152a, 152b, 152c.

In an embodiment, a material of the insulating layer 151a, the insulating layer 151b, and/or the insulating layer 151c may include an organic insulating material (such as polyimide (PI), but not limited), but the disclosure is not limited thereto.

An upper surface 150a of the second redistributed circuit structure 150 (i.e., the surface that is farthest away from the first redistributed circuit structure 160) has a groove G1. The groove G1 at least penetrates through the top insulating layer 151c of the second redistributed circuit structure 150 (i.e., the insulating layer farthest from the first redistributed circuit structure 160 in the second redistributed circuit structure 150). The groove G1 may expose the insulating layer 151b located under (for example, a lower orientation in the drawing) the top insulating layer 151c and directly contacting the top insulating layer 151c.

In an embodiment, the groove G1 does not expose any conductive layer (since none is exposed, so that none is illustrated or indicated) in the second redistributed circuit structure 150, but the present disclosure is not limited thereto.

In an embodiment, the process of forming the groove G1 of the second redistributed circuit structure 150 is as follows. An insulating material may be formed on the insulating layer 151b by means of coating. The aforementioned insulating material includes, for example, a material that may be cured by light or heat. Then, a part of the insulating material coated on the insulating layer 151b may be cured. Then, the uncured insulating material is removed to form the insulating layer 151c. The insulating layer 151c has the groove G1 exposing a part of the insulating layer 151b and an opening exposing a part of the conductive layer 152b. Then, the conductive layer 152c is formed on the insulating layer 151c. A part of the conductive layer 152c may be filled into the corresponding opening in the insulating layer 151c to connect (including: electrical connection or direct connection) to the conductive layer 152b. In addition, the conductive layer 152c is not filled into the groove G1.

Figure 1E:
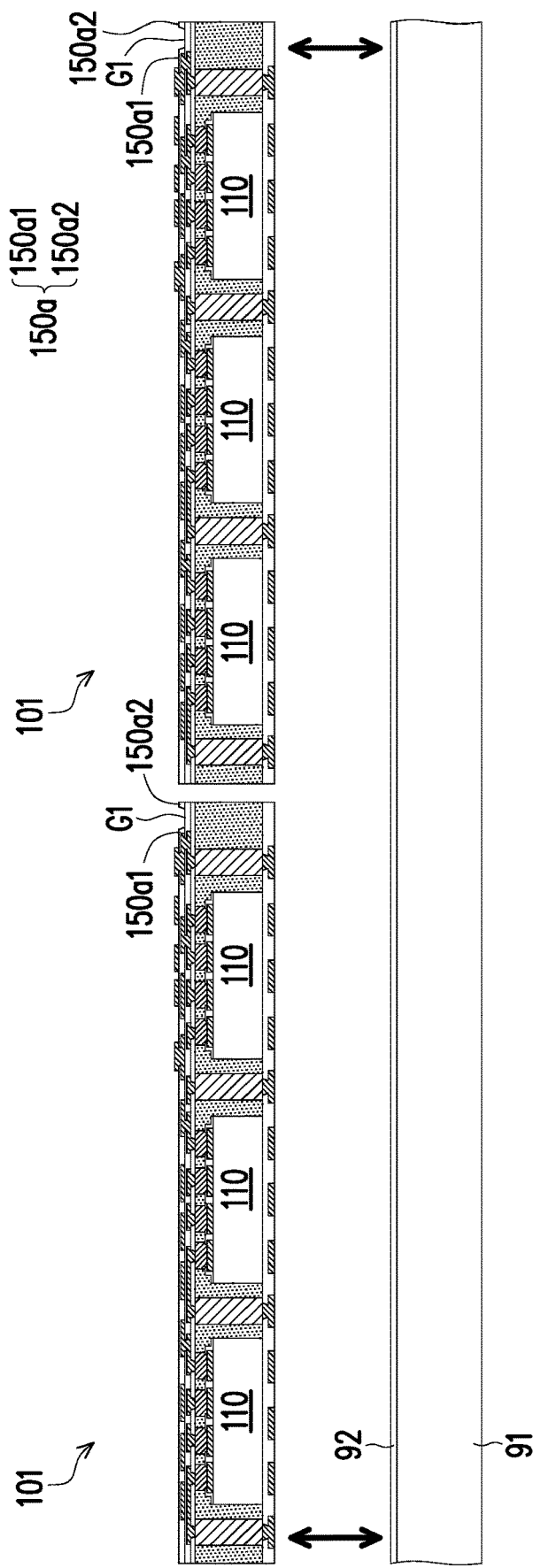

Referring to FIG. 1D to FIG. 1E, after the second redistributed circuit structure 150 is formed, the carrier board 91 may be removed and/or cutting may be performed to form a plurality of preliminary structures 101. The cutting is, for example, performed by using a rotating blade or a laser beam, but the disclosure is not limited thereto. It should be noted that, in the disclosure, the sequence of removing the carrier board 91 and performing the cutting is not limited.

It should be noted that after the cutting, similar component symbols will be used for the preliminary structures 101 after the cutting. For example, the first dies 110 (as shown in FIG. 1D) may be a plurality of first dies 110 (as shown in FIG. 1E) after cutting, and the conductive connectors 130 (as shown in FIG. 1D) may be a plurality of conductive connectors 130 (as shown in FIG. 1E) after cutting, the first redistributed circuit structure 160 (as shown in FIG. 1D) may be a plurality of first redistributed circuit structures 160 (as shown in FIG. 1E) after cutting, and the encapsulant 140 (as shown in FIG. 1D) may be a plurality of encapsulants 140 (as shown in FIG. 1E) after cutting, the second redistributed circuit structure 150 (as shown in FIG. 1D) may be a plurality of second redistributed circuit structures 150 (as shown in FIG. 1E) after cutting, the grooves G1 (as shown in FIG. 1D) may be a plurality of grooves G1 (as shown in FIG. 1E) after cutting, and so on. The other components in the preliminary structure will follow the same component symbol rules described above, which is not repeated or specifically illustrated.

Figure 1F:
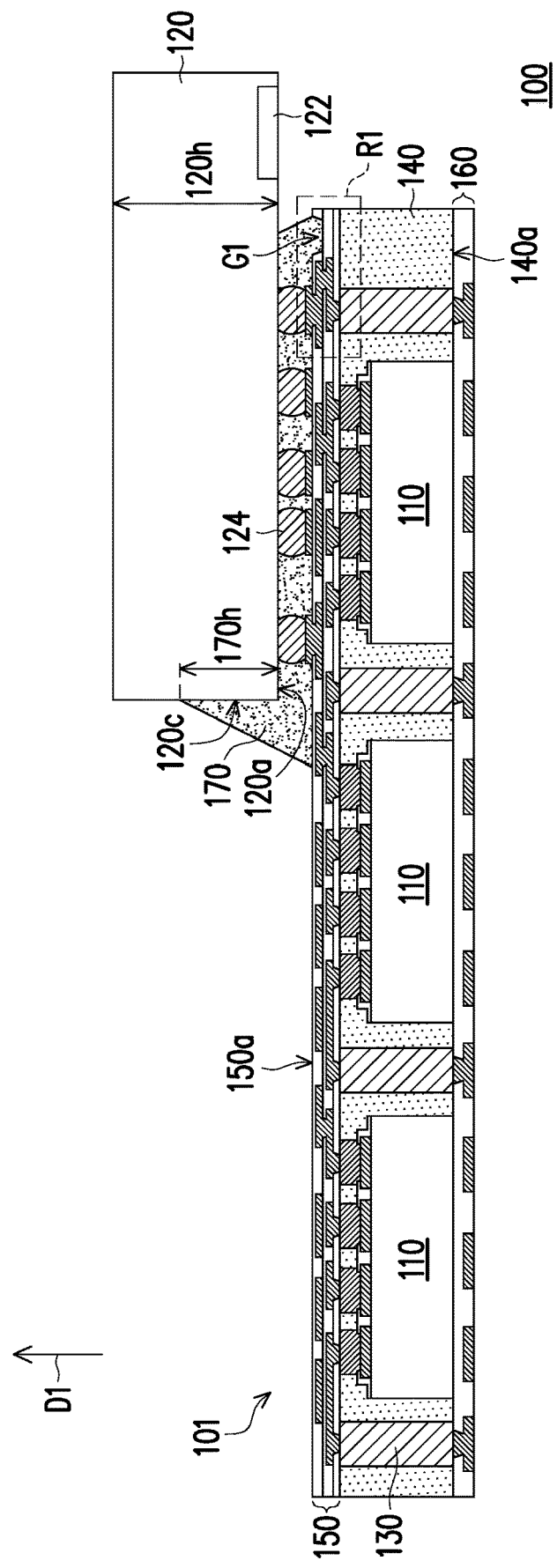
Figure 1G:
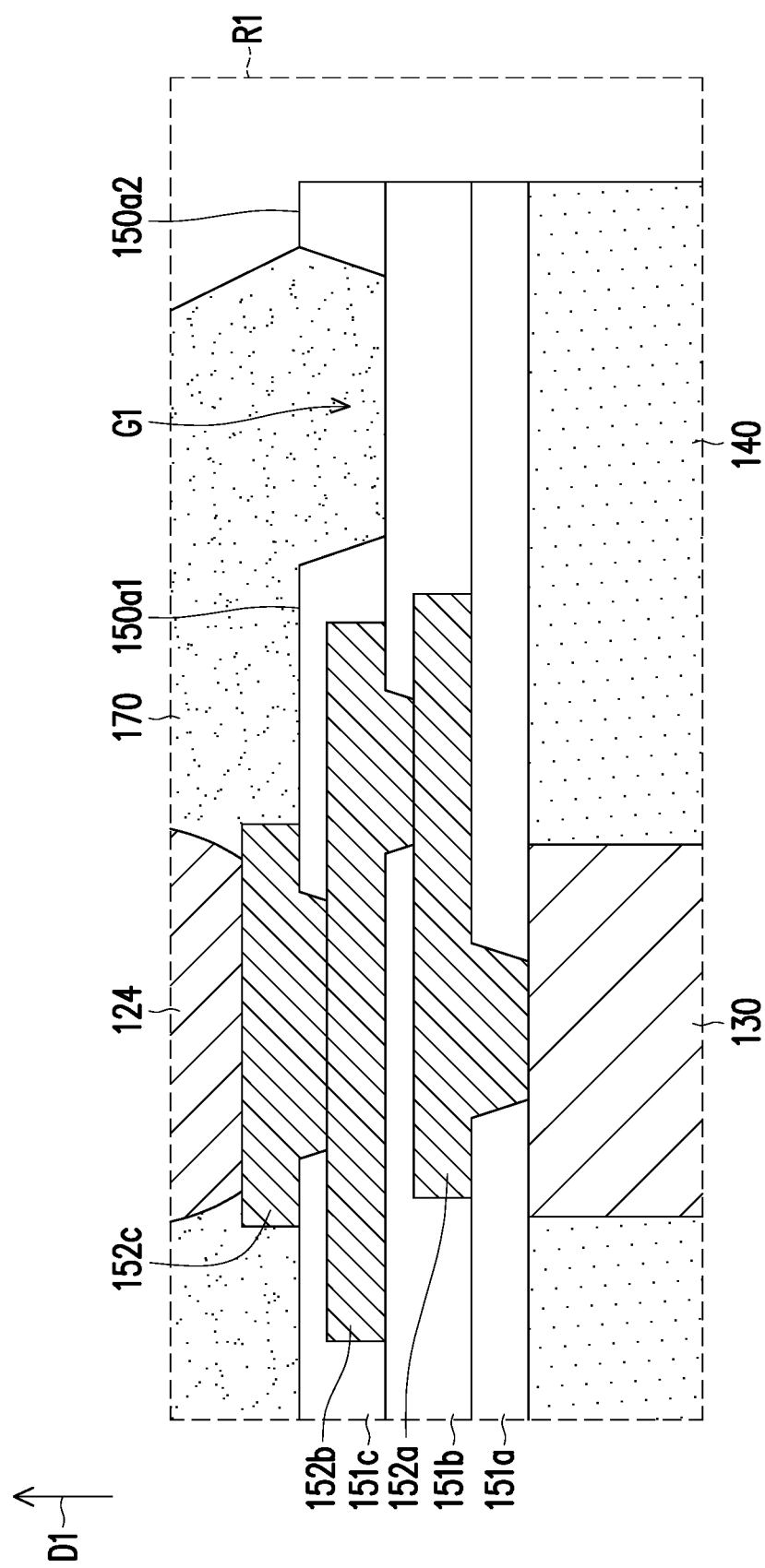
FIG. 1G is a schematic partial cross-sectional view of a package structure according to the first embodiment of the disclosure.
Figure 1H:
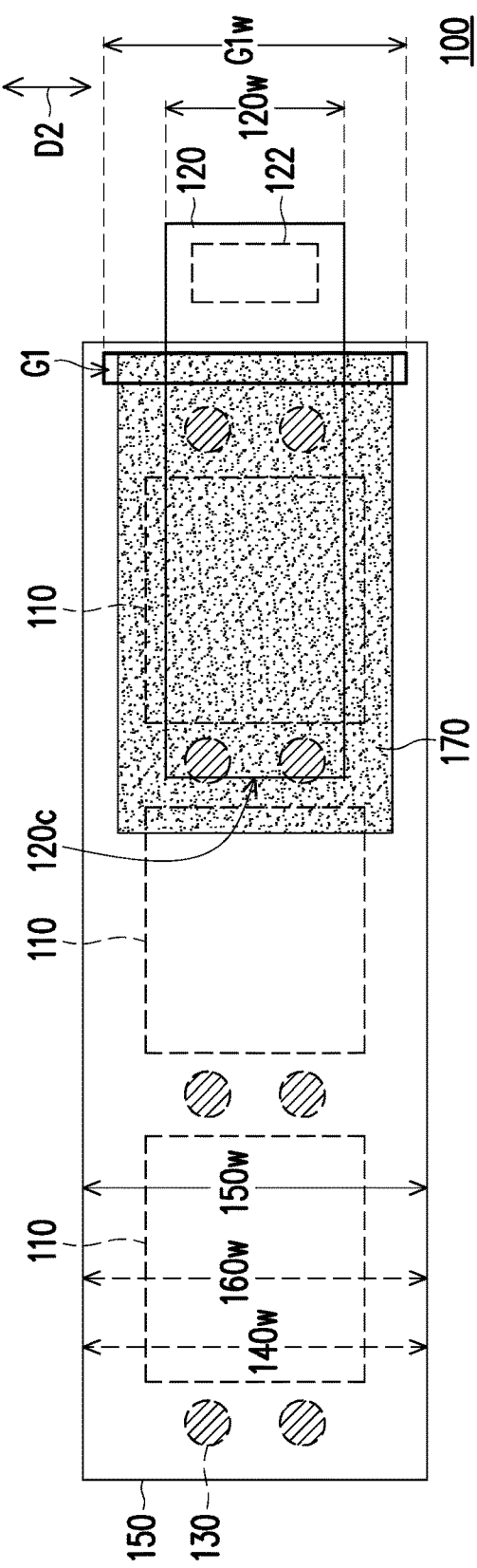
FIG. 1H is a schematic partial top view of a package structure according to the first embodiment of the disclosure.

Referring to FIG. 1E to FIG. 1F, a second die 120 is disposed on the preliminary structure 101 and is electrically connected to the second redistributed circuit structure 150. The second die 120 has a second active surface 120a. The second die 120 is disposed on the second redistributed circuit structure 150 in such a manner that the second active surface 120a thereof faces the second redistributed circuit structure 150.

The second active surface 120a of the second die 120 has an optical signal transmission area 122. The optical signal transmission area 122 may be adapted to receive or transmit optical signals. In a direction D1 perpendicular to the first molding surface 140a or the second molding surface 140b, the optical signal transmission area 122 is not overlapped with the encapsulant 140, the second redistributed circuit structure 150 and/or the first redistributed circuit structure 160. In other words, at least a part of the second die 120 (for example, the part having the optical signal transmission area 122) is overhung. In an embodiment, the second die 120 may be referred to as a silicon photonics integrated circuit, a photonic integrated circuit (PIC) or an integrated optical circuit, but the disclosure is not limited thereto.

It should be noted that in FIG. 1F, the optical signal transmission area 122 is only schematically illustrated. A shape, a film layer or a material of the optical signal transmission area 122 may be adjusted according to actual requirements, which are not limited by the disclosure.

In an embodiment, the second die 120 and the second redistributed circuit structure 150 may be electrically connected by second-die connectors 124. The second-die connectors 124 are, for example, solder balls, conductive pillars or other suitable conductive connectors, which are not limited by the disclosure.

Continually referring to FIG. 1F, a filler 170 is formed on the second redistributed circuit structure 150. Moreover, after the second die 120 is disposed on the preliminary structure 101 and the filler 170 is formed, the filler 170 may be located between the second die 120 and the second redistributed circuit structure 150. The filler 170 is, for example, a capillary underfill (CUF) or other suitable filling materials, but the disclosure is not limited thereto.

In the embodiment, after the second die 120 is disposed on the preliminary structure 101 first, the filler 170 may be formed between the second die 120 and the second redistributed circuit structure 150. For example, after the second die 120 is disposed on the preliminary structure 101, a suitable device (such as a syringe/dispenser/injector, but not limited) may be used to inject a suitable filling material on the upper surface 150a of the second redistributed circuit structure 150 from a side surface 120c of the second die 120, wherein the side surface 120c of the second die 120 is opposite to the optical signal transmission area 122. The uncured filling material may be filled between the second die 120 and the second redistributed circuit structure 150 from the side surface 120c of the second die 120, and further flow to the groove G1. A filling speed and/or a filling amount of the filling material may be controlled in an appropriate manner. In addition, the groove G1 of the second redistributed circuit structure 150 may prevent the aforementioned filling material from covering the optical signal transmission area 122 of the second die 120. Thereafter, the filling material may be cured in a suitable manner to form the filler 170.

In the embodiment, the filler 170 may also cover a part of the side surface 120c of the second die 120. In this way, a bonding strength between the second die 120 and the second redistributed circuit structure 150 may be enhanced, and a possibility that the partially overhung second die 120 is peeled off from the second redistributed circuit structure 150 is reduced.

In the embodiment, a height range 170h of the filler 170 covering a part of the side surface 120c of the second die 120 may be greater than a half of a thickness 120h of the second die 120. In this way, the bonding strength between the second die 120 and the second redistributed circuit structure 150 may be enhanced. In an embodiment, the filler 170 may completely cover the side surface 120c of the second die 120.

In the embodiment, a range of the filler 170 covering the second active surface 120a of the second die 120 may be greater than a half of the second active surface 120a of the second die 120. In this way, the bonding strength between the second die 120 and the second redistributed circuit structure 150 may be further enhanced. However, it should be noted that the filler 170 does not cover the optical signal transmission area 122 of the second die 120. Namely, the filler 170 does not completely cover the second active surface 120a of the second die 120.

In an embodiment, the height range 170h of the filler 170 covering a part of the side surface 120c of the second die 120 may be greater than a half of the thickness 120h of the second die 120, and the range of the filler 170 covering the second active surface 120a of the second die 120 may be greater than a half of the second active surface 120a of the second die 120.

In an embodiment, conductive terminals (not shown) may also be formed on the first redistributed circuit structure 160 and are electrically connected to corresponding circuits in the first redistributed circuit structure 160, but the disclosure is not limited thereto. The conductive terminals may be formed before or after the cutting process, which is not limited by the disclosure.

After the above-mentioned manufacturing process, manufacturing of the package structure 100 of the embodiment is substantially completed.

Referring to FIG. 1F to FIG. 1H, the package structure 100 includes the first dies 110, the encapsulant 140, the first redistributed circuit structure 160, the second redistributed circuit structure 150, the conductive connectors 130, the second die 120 and the filler 170. The encapsulant 140 covers the first dies 110. The encapsulant 140 has the first molding surface 140a and the second molding surface 140b opposite to the first molding surface 140a. The first redistributed circuit structure 160 is located on the first molding surface 140a of the encapsulant 140. The second redistributed circuit structure 150 is located on the second molding surface 140b of the encapsulant 140. Corresponding circuits in the second redistributed circuit structure 150 are electrically connected to the first die 110. The conductive connectors 130 penetrate through the encapsulant 140 and are electrically connected to the corresponding circuits in the first redistributed circuit structure 160 and the corresponding circuits in the second redistributed circuit structure 150. The second die 120 is disposed on the second redistributed circuit structure 150. The second die 120 is electrically connected to the corresponding circuits in the second redistributed circuit structure 150. The second die 120 has the optical signal transmission area 122. The filler 170 is located between the second die 120 and the second redistributed circuit structure 150. The upper surface 150a of the second redistributed circuit structure 150 has the groove G1. The upper surface 150a of the second redistributed circuit structure 150 includes a first area 150a1 and a second area 150a2 located on two opposite sides of the groove G1. The filler 170 directly contacts the first area 150a1, and the filler 170 is disposed away from the second area 150a2.

In an embodiment, the first die 110 may be, for example, an electrical integrated circuit (EIC), an application-specific integrated circuit (ASIC), a controller die, or a die including other suitable components, but the disclosure is not limited thereto. In an embodiment, the first dies 110 may be homogeneous dies or heterogeneous dies, which is not limited by the disclosure.

In the embodiment, the first die 110 may be electrically connected to the corresponding circuit in the first redistributed circuit structure 160 through the corresponding circuit in the second redistributed circuit structure 150 and/or the corresponding conductive connector 130, so as to perform signal and/or power transmission, but the disclosure is not limited thereto. In one embodiment, the first die 110 does not have a through silicon via (TSV).

In the embodiment, the second die 120 may be electrically connected to the corresponding circuit in the first redistributed circuit structure 160 through the corresponding second-die connector 124, the corresponding circuit in the second redistributed circuit structure 150, and/or the corresponding conductive connector 130 to implement signal and/or power transmission; and/or the second die 120 may implement signal and/or power transmission with the first die 110 through the corresponding second-die connector 124 and/or the corresponding circuit in the second redistributed circuit structure 150, but the disclosure is not limited thereto.

In the embodiment, the groove G1 may have a strip shape, but the disclosure is not limited thereto. A sidewall of the groove G1 may be a slope. In an extending direction D2 of the groove G1, a size G1w of the groove G1 is larger than a size 120w of the second die 120. The size G1w of the groove G1 is smaller than a size 140w of the encapsulant 140 (or, the first molding surface 140a of the encapsulant 140), an overall size 150w of the second redistributed circuit structure 150, and/or an overall size 160w of the first redistributed circuit structure 160.

In the embodiment, the filler 170 may also be filled into the groove G1. In other words, the filler 170 may directly contact the first area 150a1 and the groove G1, but does not contact the second area 150a2. In this way, the filler 170 between the second die 120 and the second redistributed circuit structure 150 may take the groove G1 as a boundary to prevent the filler 170 from overflowing an edge of the second redistributed circuit structure 150 to further cover to optical signal transmission area 122. In this way, the package structure 100 may have better quality or yield.

In an embodiment, the filler 170 may be unfilled or partially filled in the groove G1, and the filler 170 does not contact the second area 150a2.

In the embodiment, when viewing in the direction D1 perpendicular to the first molding surface 140a or the second molding surface 140b (as shown in FIG. 1H), there is the groove G1 between any point on the optical signal transmission area 122 and any point on the filler 170. Namely, when the package structure 100 is manufactured, the groove G1 may be used to ensure that the filler 170 does not cover the optical signal transmission area 122 of the second die 120.

In an embodiment, the package structure 100 may optionally further include conductive terminals (not shown). The conductive terminals may be disposed on the first redistributed circuit structure 160, so that the corresponding circuits in the first redistributed circuit structure 160 may be electrically connected to external conductive elements through the conductive terminals.

It should be noted that in the embodiment, only three first dies 110 and one second die 120 in the package structure 100 are schematically illustrated, but the number of the first dies 110 and the second dies 120 in the package structure 100 is not limited by the disclosure, which may be adjusted according to actual design requirements.

In the embodiment, the number of the grooves G1 may be the same as the number of the second dies 120, but the disclosure is not limited thereto.

In an exemplary application, a light guide element (such as an optical fiber, but the disclosure is not limited thereto) may contact (such as direct contact; or indirectly contact through an optical adhesive; or, partial direct contact and partial indirect contact) the optical signal transmission area 122 of the second die 120 of the package structure 100, so that the second die 120 may receive or transmit corresponding optical signals through the aforementioned light guide element. Therefore, through the configuration method of the filler 170 (for example, the aforementioned method that the filler 170 covers the second die 120), when the light guide element contacts the optical signal transmission area 122 of the second die 120 of the package structure 100, the possibility that the second die 120 is peeled off from the second redistribution circuit structure 150 is reduced. In addition, through the configuration of the groove G1 of the second redistributed circuit structure 150, the aforementioned filling material may be prevented from covering the optical signal transmission area 122 of the second die 120. In this way, the package structure 100 may have better quality.

Figure 2:
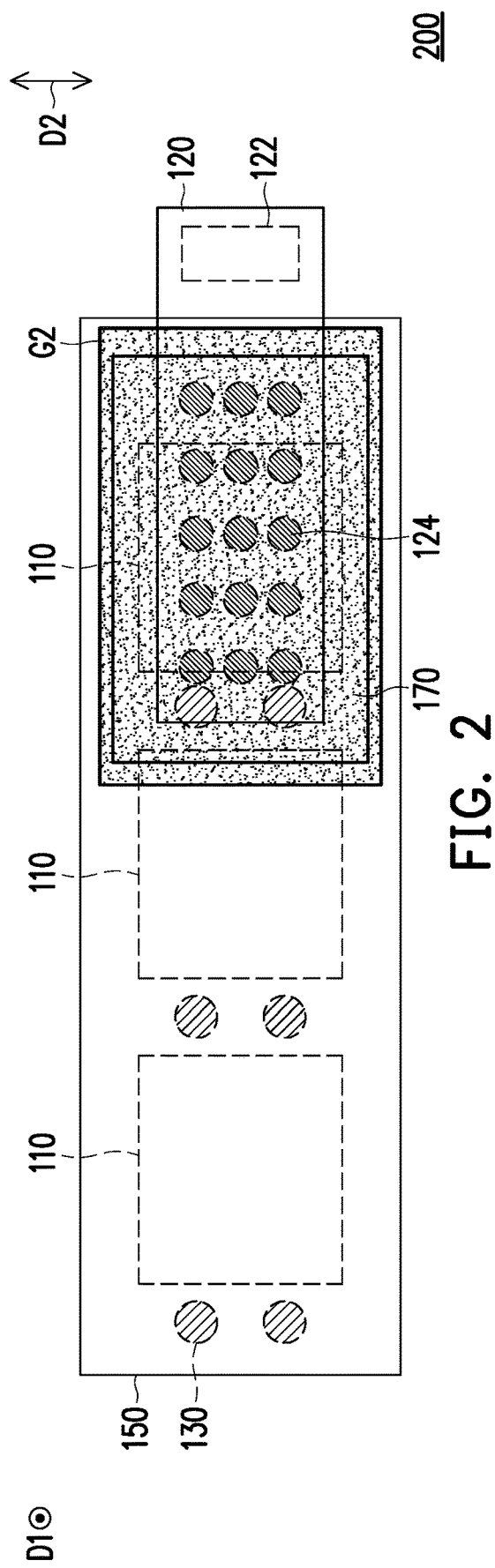
FIG. 2 is a schematic partial top view of a package structure according to a second embodiment of the disclosure.

FIG. 2 is a schematic partial top view of a package structure according to a second embodiment of the disclosure. A package structure 200 and its manufacturing method of the embodiment are similar to the package structure 100 and its manufacturing method of the first embodiment, where the similar components are denoted by the same reference numerals and have similar functions, materials or formation methods, and descriptions thereof are omitted. In addition, for clarity's sake, a part of the film layers or components is omitted in FIG. 2, and/or another part of the film layers or the components is shown in a perspective manner.

Referring to FIG. 2, in the embodiment, the groove G2 has a ring shape.

In the embodiment, when viewing in the direction D1 perpendicular to the first molding surface 140a or the second molding surface 140b, the groove G2 may surround the second-die connectors 124.

In the embodiment, when viewing in the direction D1 perpendicular to the first molding surface 140a or the second molding surface 140b, a range of the filler 170 may be less than or equal to a range surrounded by the groove G2.

Figure 3A:
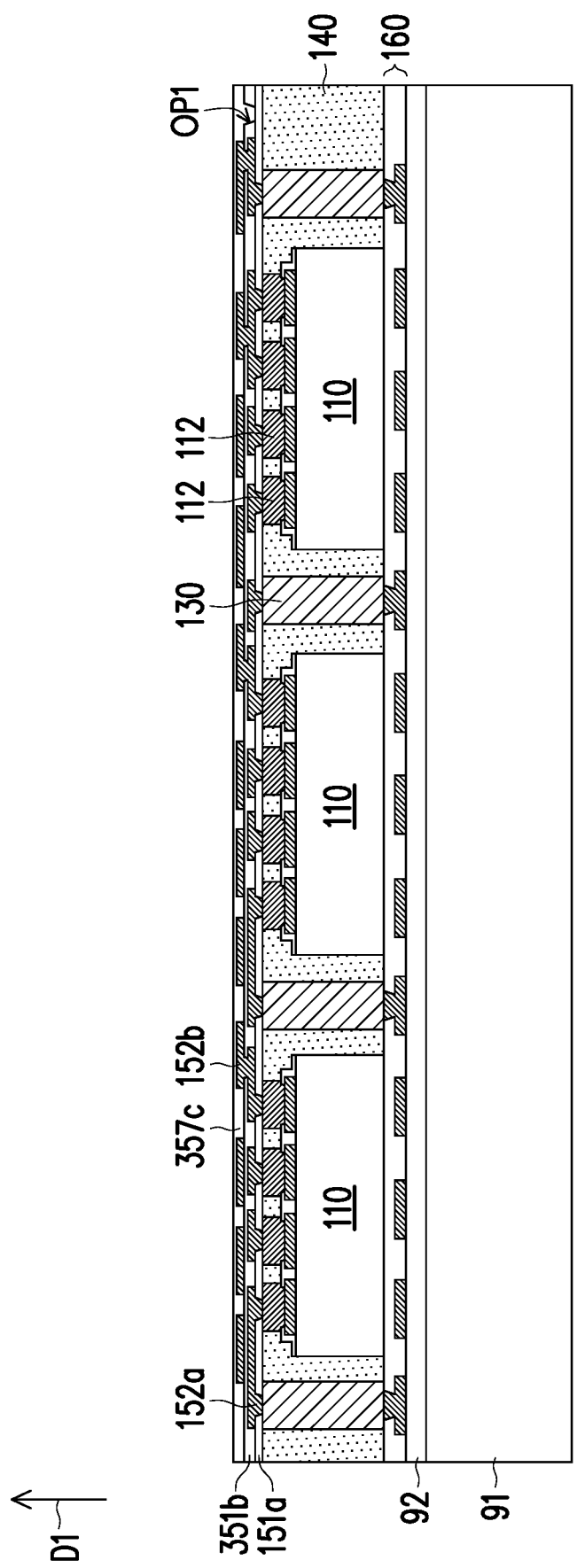
FIG. 3A to FIG. 3D are schematic partial cross-sectional views of a part of a manufacturing method of a package structure according to a third embodiment of the disclosure.
Figure 3B:
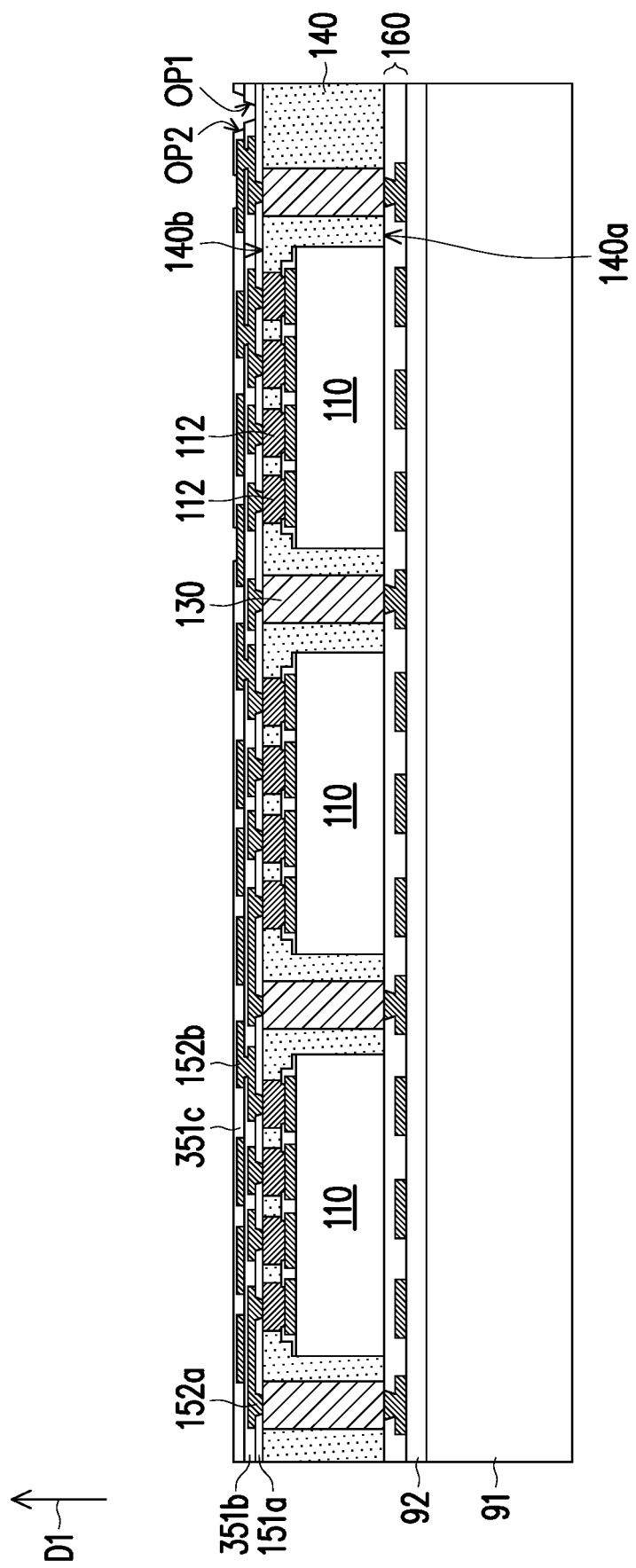
Figure 3C:
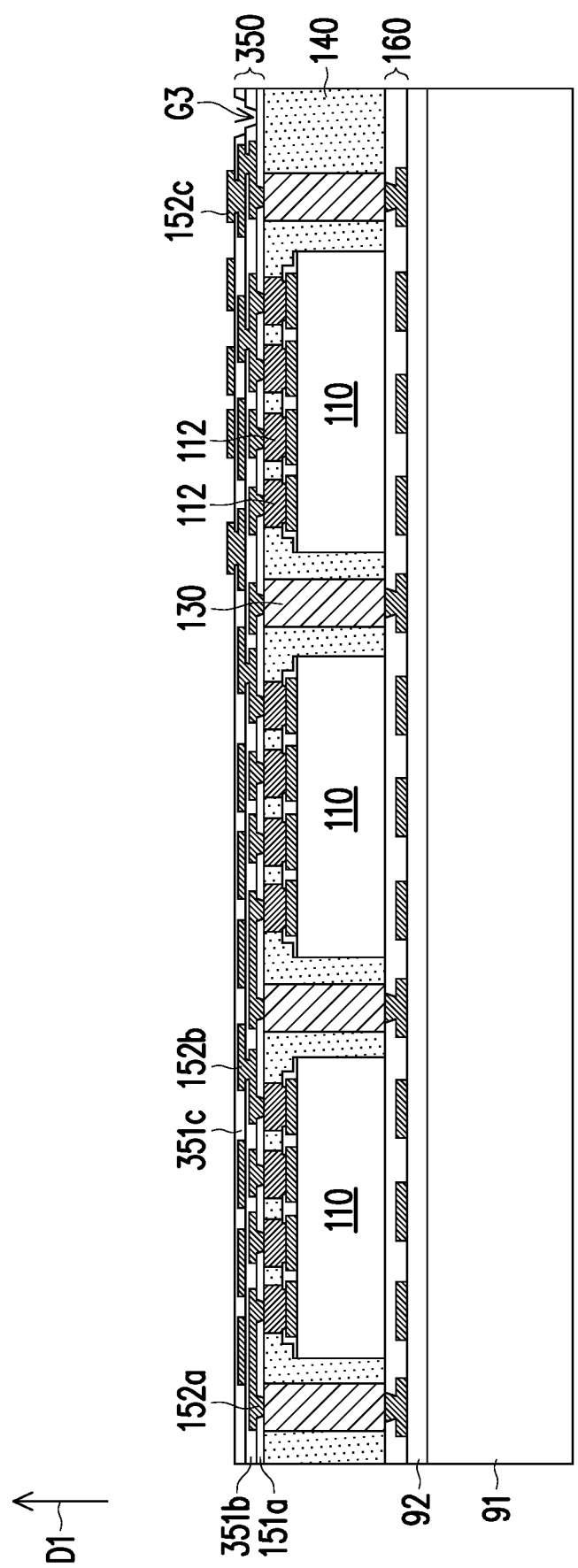

FIG. 3A to FIG. 3D are schematic partial cross-sectional views of a part of a manufacturing method of a package structure according to a third embodiment of the disclosure. A package structure 300 and its manufacturing method of the embodiment are similar to the package structure 100 and its manufacturing method of the first embodiment, where the similar components are denoted by the same reference numerals and have similar functions, materials or formation methods, and descriptions thereof are omitted. For example, FIG. 3A is a schematic partial cross-sectional view of the manufacturing method of the package structure following the steps of FIG. 1C. In addition, for clarity's sake, the repeated units may be omitted in FIG. 3A to FIG. 3C. For example, FIG. 3A to FIG. 3C are steps that may follow a left or right structure of FIG. 1C. It should be understood that the same or similar steps may also be applied to the repeated units that may not be shown in FIG. 3A to FIG. 3C. The region illustrated in FIG. 3D may be similar to the region R1 in FIG. 1F.

In the embodiment, an example of a formation method of a second redistributed circuit structure 350 (indicated in FIG. 3C or FIG. 3D) having a groove G3 is as follows.

Referring to FIG. 3A, an insulating material may be formed on the insulating layer 151a by means of coating. The aforementioned insulating material includes, for example, a material that may be cured by light or heat. Then, a part of the insulating material coated on the insulating layer 151a may be cured. Thereafter, the uncured insulating material is removed to form an insulating layer 351b. The insulating layer 351b has an opening OP1 exposing a part of the insulating layer 151a and an opening exposing a part of the conductive layer 152a. Then, a conductive layer 152b is formed on the insulating layer 351b. A part of the conductive layer 152b may be filled into the opening of the insulating layer 351b to connect (including electrical connection or direct connection) the conductive layer 152a. Then, an insulating material 357c may be formed on the insulating layer 351b by means of coating. The insulating material 357c may be filled into the opening OP1 of the insulating layer 351b. The insulating material 357c includes, for example, a material that may be cured by light or heat.

Referring to FIG. 3A to FIG. 3B, a part of the insulating material 357c may be cured. Then, the uncured insulating material 357c is removed to form an insulating layer 351c. The insulating layer 351c has an opening OP2 and an opening exposing a part of the conductive layer 152b. The opening OP2 of the insulating layer 351c corresponds to the opening OP1 of the insulating layer 351b. An opening area of the opening OP2 may be larger than an opening area of the opening OP1. Moreover, in the direction D1 perpendicular to the first molding surface 140a or the second molding surface 140b, an opening range of the opening OP1 may be located within an opening range of the opening OP2.

Referring to FIG. 3B to FIG. 3C, a conductive layer 152c is formed on the insulating layer 351c. A part of the conductive layer 152c may be filled into the opening of the insulating layer 351c to connect (including electrical connection or direct connection) the conductive layer 152b.

Referring to FIG. 3C, after the aforementioned manufacturing process, manufacturing of the second redistributed circuit structure 350 of the embodiment may be substantially completed. The groove G3 of the second redistributed circuit structure 350 may be formed by at least the opening OP2 of the insulating layer 351c and the opening OP1 of the insulating layer 351b.

Figure 3D:
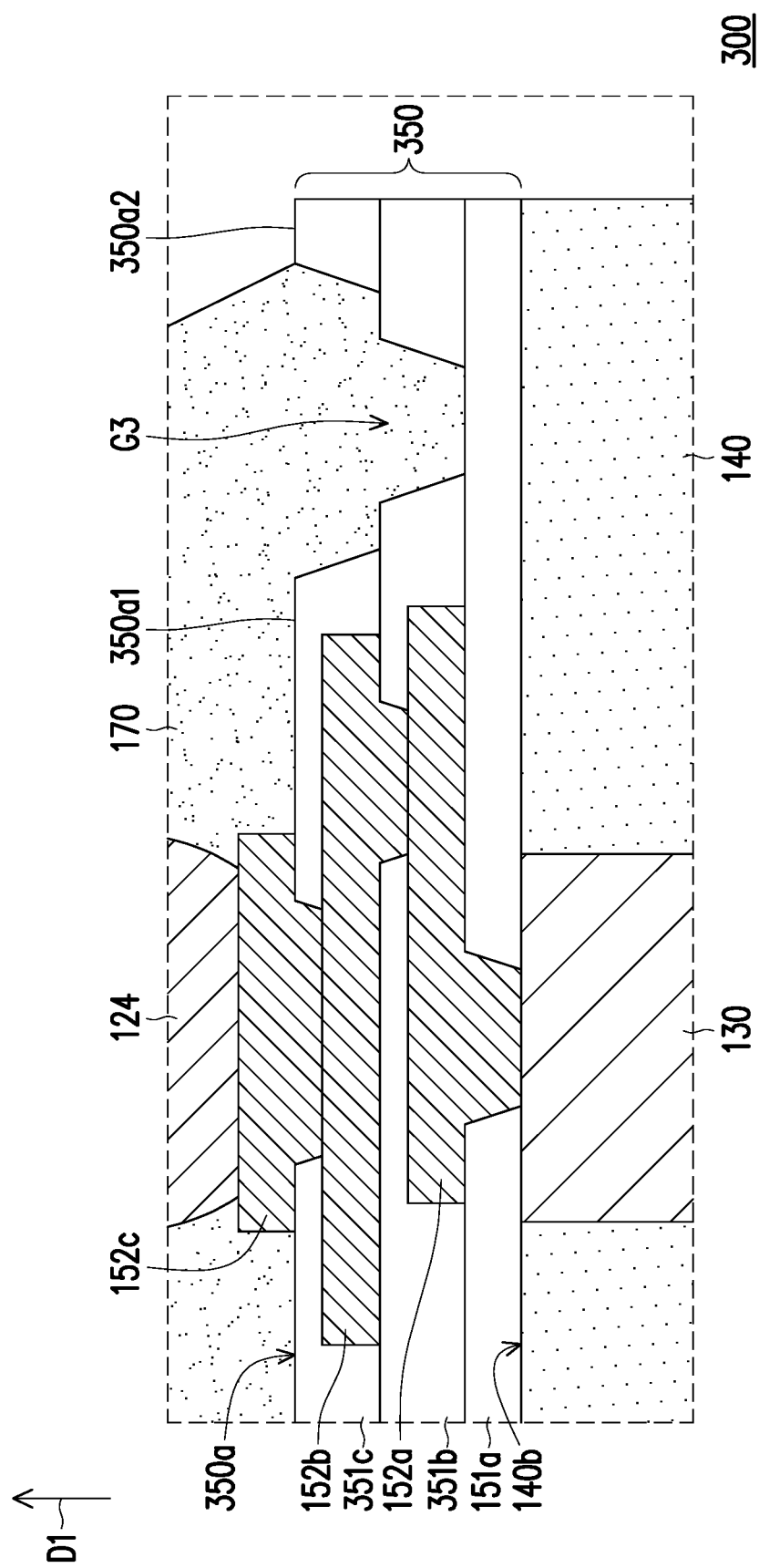

Referring to FIG. 3C to FIG. 3D, the same or similar steps as shown in FIG. 1E to FIG. 1F may be used to roughly complete the manufacturing of the package structure 300 of the embodiment.

It should be noted that FIG. 3D is an enlarged schematic view of a region similar to the region R1 in FIG. 1F. Therefore, although a part of the components or a part of the film layers is not shown in FIG. 3D, in other places that are not shown, there may be the same or similar components or film layers as shown in FIG. 1F.

Referring to FIG. 3D, the package structure 300 includes a first die (not directly shown, which may be the same as the first die 110 of the aforementioned embodiment), the encapsulant 140, a first redistributed circuit structure (not directly shown, which may be the same as the first redistributed circuit structure 160 of the aforementioned embodiment), the second redistributed circuit structure 350, the conductive connector 130, a second chip (not directly shown, which may be the same as the second die 120 of the aforementioned embodiment) and the filler 170. The second redistributed circuit structure 350 is located on the second molding surface 140b of the encapsulant 140. The corresponding circuit in the second redistributed circuit structure 350 is electrically connected to the first die. The conductive connector 130 penetrates through the encapsulant 140 and is electrically connected to the corresponding circuit in the first redistributed circuit structure and the corresponding circuit in the second redistributed circuit structure 350. The second die is disposed on the second redistributed circuit structure 350. The second die is electrically connected to the corresponding circuit in the second redistributed circuit structure 350. The filler 170 is located between the second die and the second redistributed circuit structure 350. An upper surface 350a of the second redistribution circuit structure 350 has a groove G3. The upper surface 350a of the second redistributed circuit structure 350 includes a first area 350a1 and a second area 350a2 located on two opposite sides of the groove G3. The filler 170 directly contacts the first area 350a1, and the filler 170 is disposed away from the second area 350a2.

In the embodiment, a sidewall of the groove G3 may have a stepped structure.

In the embodiment, the groove G3 of the package structure 300 may have a strip shape (as shown in FIG. 1H), but the disclosure is not limited thereto. In an embodiment, a groove similar to the groove G3 (for example, a groove having a sidewall with a stepped structure) may have a ring shape (as shown in FIG. 2).

Figure 4A:
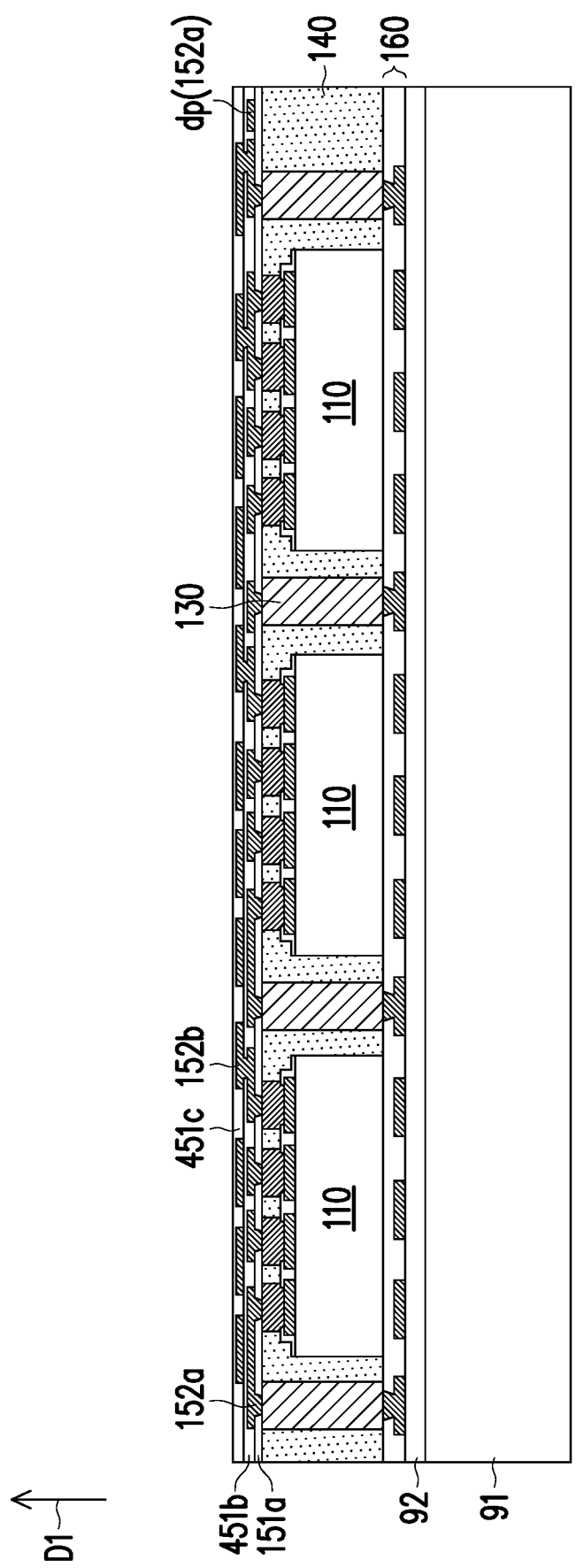
FIG. 4A to FIG. 4C are schematic partial cross-sectional views of a part of a manufacturing method of a package structure according to a fourth embodiment of the disclosure.
Figure 4B:
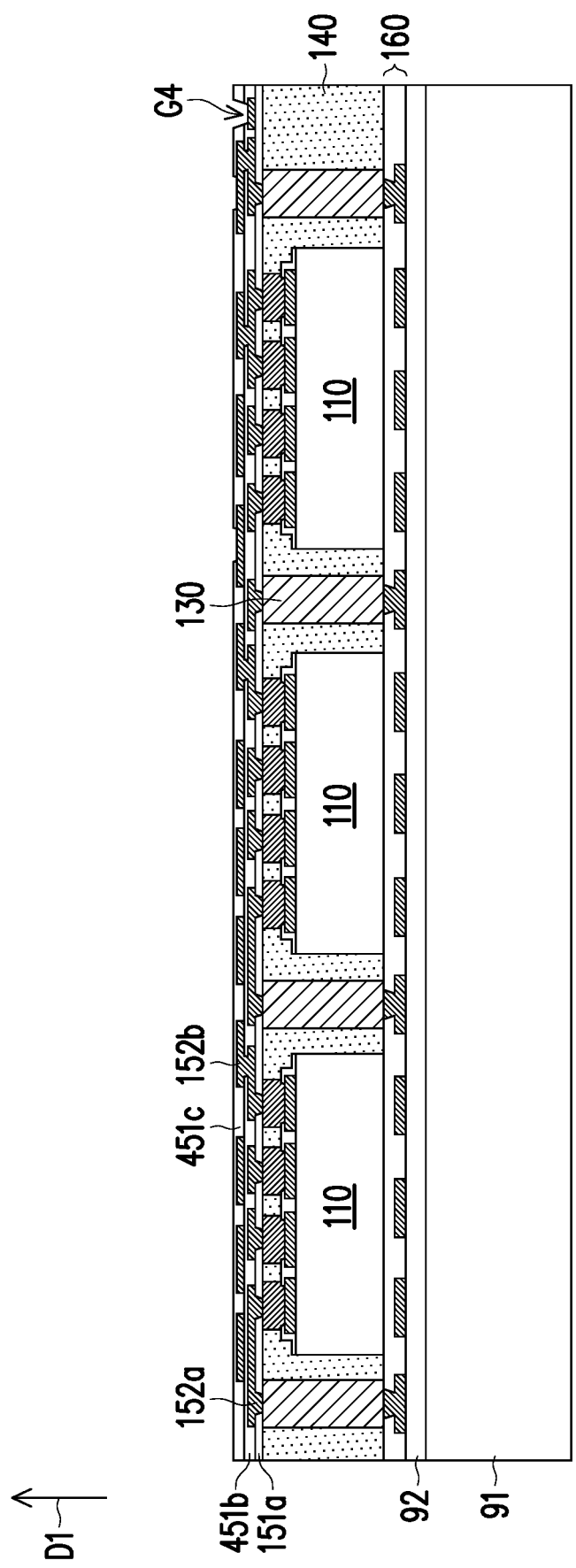
Figure 4C:
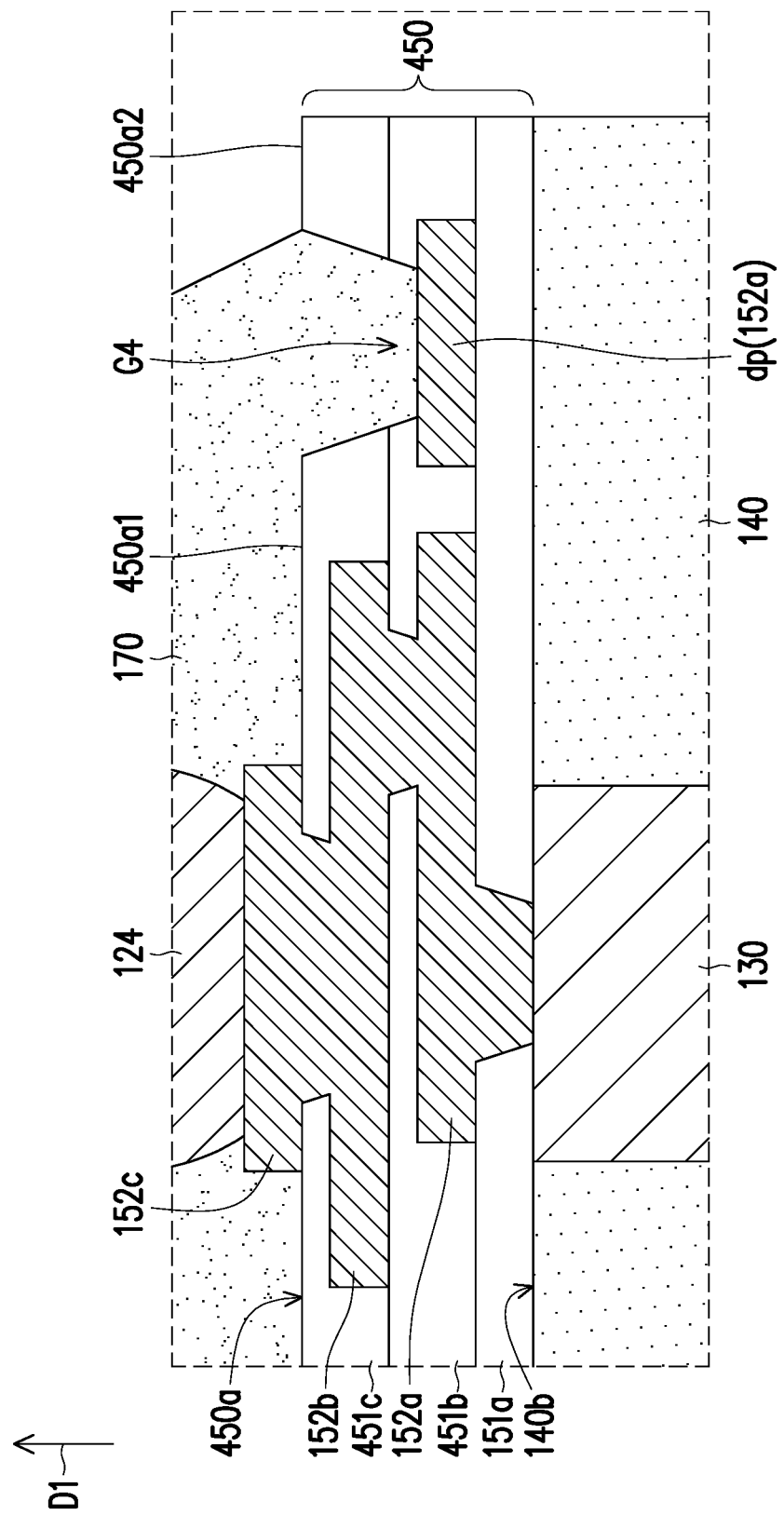

FIG. 4A to FIG. 4C are schematic partial cross-sectional views of a part of a manufacturing method of a package structure according to a fourth embodiment of the disclosure. A package structure 400 and its manufacturing method of the embodiment are similar to the package structure 100 and its manufacturing method of the first embodiment, where the similar components are denoted by the same reference numerals and have similar functions, materials or formation methods, and descriptions thereof are omitted. For example, FIG. 4A is a schematic partial cross-sectional view of the manufacturing method of the package structure following the steps of FIG. 1C. In addition, for clarity's sake, the repeated units may be omitted in FIG. 4A to FIG. 4B. For example, FIG. 4A to FIG. 4B are steps that may follow a left or right structure of FIG. 1C. It should be understood that the same or similar steps may also be applied to the repeated units that may not be shown in FIG. 4A to FIG. 4B. The region illustrated in FIG. 4C may be similar to the region R1 in FIG. 1F.

In the embodiment, an example of a formation method of a second redistributed circuit structure 450 (indicated in FIG. 4C) having a groove G4 is as follows.

Referring to FIG. 4A, the conductive layer 152a may include a dummy pad dp. Then, an insulating layer 451b, the conductive layer 152b, and an insulating layer 451c may be formed on the insulating layer 151a by means of a deposition, lithography and/or etching process.

In an embodiment, a material of the insulating layer 451b and/or a material of the insulating layer 451c may include silicon oxide, silicon nitride, silicon oxynitride, or a combination thereof, but the disclosure is not limited thereto.

In an embodiment, the material of the insulating layer 451b and the material of the insulating layer 451c may be the same or similar, but the disclosure is not limited thereto.

Referring to FIG. 4A to FIG. 4B, the opening that exposes a part of the conductive layer 152b and the groove G4 may be formed by means of etching. The groove G4 may correspond to the dummy pad dp. In an embodiment, the dummy pad dp may be referred to as an etching stop layer, but the present disclosure is not limited thereto.

Referring to FIG. 4B to FIG. 4C, after the groove G4 is formed, the conductive layer 152c is formed on the insulating layer 451c. A part of the conductive layer 152c may be filled into the opening of the insulating layer 451c to connect (including electrical connection or direct connection) the conductive layer 152b.

In the embodiment, the dummy pad dp is a part of the conductive layer 152a, but the disclosure is not limited thereto. In an embodiment, the dummy pad dp may be a part of any conductive layer other than the top conductive layer (for example, the conductive layer 152c) in the second redistributed circuit structure 450.

After the aforementioned manufacturing processes, manufacturing of the second redistributed circuit structure 450 of the embodiment may be substantially completed. The groove G4 of the second redistributed circuit structure 450 may be located on the dummy pad dp.

Continually referring to FIG. 4C, manufacturing of the package structure 400 of the embodiment may be substantially completed by executing the same or similar steps shown in FIG. 1E to FIG. 1F.

It should be noted that FIG. 4C is an enlarged schematic view of a region similar to the region R1 in FIG. 1F. Therefore, although a part of the components or a part of the film layers is not shown in FIG. 4C, in other places that are not shown, there may be the same or similar components or film layers as shown in FIG. 1F.

Referring to FIG. 4C, the package structure 400 includes a first die (not directly shown, which may be the same as the first die 110 of the aforementioned embodiment), the encapsulant 140, a first redistributed circuit structure (not directly shown, which may be the same as the first redistributed circuit structure 160 of the aforementioned embodiment), the second redistributed circuit structure 450, the conductive connector 130, a second chip (not directly shown, which may be the same as the second die 120 of the aforementioned embodiment) and the filler 170. The second redistributed circuit structure 450 is located on the second molding surface 140b of the encapsulant 140. The corresponding circuit in the second redistributed circuit structure 450 is electrically connected to the first die. The conductive connector 130 penetrates through the encapsulant 140 and is electrically connected to the corresponding circuit in the first redistributed circuit structure and the corresponding circuit in the second redistributed circuit structure 450. The second die is disposed on the second redistributed circuit structure 450. The second die is electrically connected to the corresponding circuit in the second redistributed circuit structure 450. The filler 170 is located between the second die and the second redistributed circuit structure 450. An upper surface 450a of the second redistribution circuit structure 450 has the groove G4. The upper surface 450a of the second redistributed circuit structure 450 includes a first area 450a1 and a second area 450a2 located on two opposite sides of the groove G4. The filler 170 directly contacts the first area 450a1, and the filler 170 is disposed away from the second area 450a2.

In the embodiment, the groove G4 of the package structure 400 may have a strip shape (as shown in FIG. 1H), but the disclosure is not limited thereto. In an embodiment, a groove similar to the groove G4 (for example, a groove penetrating through a plurality of insulating layers and having an inclined sidewall) may have a ring shape (as shown in FIG. 2).

In summary, the manufacturing method of the package structure of the disclosure may lead to better quality of the package structure, and/or the package structure of the disclosure may have better quality.

It will be apparent to those skilled in the art that various modifications and variations can be made to the disclosed embodiments without departing from the scope or spirit of the disclosure. In view of the foregoing, it is intended that the disclosure covers modifications and variations provided they fall within the scope of the following claims and their equivalents.

What is claimed is:

1. A package structure, comprising:
    a first die;
    an encapsulant, covering the first die, and having a first molding surface and a second molding surface opposite to the first molding surface;
    a first redistributed circuit structure, disposed on the first molding surface of the encapsulant;
    a second redistributed circuit structure, disposed on the second molding surface of the encapsulant and electrically connected to the first die;
    a conductive connector, penetrating through the encapsulant and electrically connected to the first redistributed circuit structure and the second redistributed circuit structure;
    a second die, disposed on the second redistributed circuit structure and electrically connected to the second redistributed circuit structure, wherein the second die has an optical signal transmission area; and
    a filler, disposed between the second die and the second redistributed circuit structure, wherein:
        an upper surface of the second redistributed circuit structure has a groove, and the upper surface comprises a first area and a second area disposed on two opposite sides of the groove;
        the filler directly contacts the first area; and
        the filler is disposed away from the second area, wherein in a direction perpendicular to the first molding surface or the second molding surface, the optical signal transmission area of the second die is not overlapped with the encapsulant.

2. The package structure as claimed in claim 1, wherein the filler further covers a part of a side surface of the second die.

3. The package structure as claimed in claim 1, wherein the filler is further filled into the groove.

4. The package structure as claimed in claim 1, wherein the groove has a strip portion, and in an extending direction of the strip portion of the groove, a size of the strip portion of the groove is larger than a size of the second die, and the size of the strip portion of the groove is smaller than a size of the encapsulant, a size of the first redistributed circuit structure, or a size of the second redistributed circuit structure.

5. The package structure as claimed in claim 1, further comprising:
    a plurality of second-die connectors, located between the second die and the second redistributed circuit structure, and electrically connected to the second die and the second redistributed circuit structure, wherein the groove has a ring shape and surrounds the second-die connectors.

6. The package structure as claimed in claim 1, wherein the second redistributed circuit structure comprises:
    a top insulating layer, wherein the groove penetrates through the top insulating layer; and
    a top conductive layer, located on the top insulating layer, and a part of the top conductive layer being further embedded in the top insulating layer.

7. The package structure as claimed in claim 1, wherein a sidewall of the groove is a slope.

8. The package structure as claimed in claim 7, wherein the second redistributed circuit structure comprises a dummy pad, and the groove exposes a surface of the dummy pad.

9. The package structure as claimed in claim 1, wherein a sidewall of the groove has a stepped structure.

10. A manufacturing method of a package structure, comprising:
    providing a preliminary structure, comprising:
        a first die;
        an encapsulant, covering the first die, and having a first molding surface and a second molding surface opposite to the first molding surface;
        a first redistributed circuit structure, disposed on the first molding surface of the encapsulant;
        a second redistributed circuit structure, disposed on the second molding surface of the encapsulant and electrically connected to the first die, wherein an upper surface of the second redistributed circuit structure has a groove, and the upper surface comprises a first area and a second area disposed on two opposite sides of the groove; and
        a conductive connector, penetrating through the encapsulant and electrically connected to the first redistributed circuit structure and the second redistributed circuit structure;
    disposing a second die on the preliminary structure to be electrically connected to the second redistributed circuit structure, wherein the second die has an optical signal transmission area; and
    forming a filler between the second die and the second redistributed circuit structure, wherein the filler directly contacts the first area, and the filler is disposed away from the second area, wherein in a direction perpendicular to the first molding surface or the second molding surface, the optical signal transmission area of the second die is not overlapped with the encapsulant.

11. The manufacturing method of the package structure as claimed in claim 10, wherein forming the second redistributed circuit structure of the preliminary structure comprises:
    forming a top insulating material layer; and
    removing a part of the top insulating material layer to form the groove.

12. The manufacturing method of the package structure as claimed in claim 11, wherein forming the second redistributed circuit structure of the preliminary structure further comprises:
    forming the top insulating material layer on a dummy pad; and
    removing a part of the top insulating material layer to expose the dummy pad, so as to form the groove.

13. The manufacturing method of the package structure as claimed in claim 11, wherein forming the second redistributed circuit structure of the preliminary structure further comprises:
    forming an insulating layer having an insulating opening;
    forming the top insulating material layer on the insulating layer and further filling the insulating opening; and
    removing a part of the top insulating material layer located in the insulating opening and corresponding to the insulating opening, so as to form the groove.

14. The manufacturing method of the package structure as claimed in claim 11, further comprising:
    after forming the groove, performing cutting to form a plurality of the preliminary structures.

* * * * *